United States Patent [19]

Abraham et al.

[11] 4,055,814

[45] Oct. 25, 1977

[54] PHASE LOCKED LOOP FOR SYNCHRONIZING VCO WITH DIGITAL DATA PULSES

[75] Inventors: Robert C. Abraham, Thousand Oaks; James E. D. Cline, Northridge, both of Calif.

[73] Assignee: Pertec Computer Corporation, El Segundo, Calif.

[21] Appl. No.: 695,323

[22] Filed: June 14, 1976

[51] Int. Cl.² ............................................. H03B 3/04
[52] U.S. Cl. ................................... 331/1 A; 307/232; 328/133; 328/155; 331/11; 331/27; 360/51
[58] Field of Search .................. 331/1 A, 11, 18, 25, 331/27; 329/122; 360/51; 307/232; 328/133, 134, 155

[56] References Cited

U.S. PATENT DOCUMENTS

| | | | |
|---|---|---|---|
| 3,383,619 | 5/1968 | Naubereit et al. | 331/27 X |
| 3,671,876 | 6/1972 | Oshiro | 328/134 |
| 3,943,454 | 3/1976 | Gefgen | 328/133 |
| 3,944,940 | 3/1976 | Desai | 329/122 |

Primary Examiner—Siegfried H. Grimm
Attorney, Agent, or Firm—Lindenberg, Freilich, Wasserman, Rosen & Fernandez

[57] ABSTRACT

A phase-locked loop is provided with a phase detector capable of providing phase error magnitude and direction information for synchronizing a voltage controlled oscillator with a train of data pulses spaced apart in integral multiples of a fundamental clock period using an edge-triggered flip-flop and simple digital logic gates.

4 Claims, 4 Drawing Figures

PHASE LOCKED LOOP FOR SYNCHRONIZING VCO WITH DIGITAL DATA PULSES

BACKGROUND OF THE INVENTION

This invention relates to a phase-locked loop for generating the fundamental clock period in a binary data pulse train as it is read from a magnetic storage medium, and more particularly to an improvement in the phase error detection portion of the loop.

An improved phase-locked loop (PLL) has been disclosed in U.S. Pat. No. 3,944,940. In that PLL, coincidence gating means are employed for phase error detection between a feedback pulse train and a read pulse train. The feedback pulse train is generated by a voltage controlled oscillator (VCO) driving a single stage binary counter. The central frequency of the VCO is twice the nominal frequency of the read pulse train so that the output of the single stage binary counter is a squarewave signal at the nominal frequency of the read pulse train. The true output of the binary counter is compared with the phase of the read pulse train in one gate of the coincidence gating means while the complementary output of the binary counter is compared with the phase of the read pulse train in a second gate of the coincidence gating means.

The read pulses are shaped to have a pulse width approximately one quarter of a data bit period of double-frequency data modulation where a bit 1 pulse is recorded in the second half of a bit cell and a clock pulse is recorded in the first half. Only the clock pulse is recorded in the first half of a bit cell for a bit 0. Upon reading the recorded data and interlaced clock pulses, a train of read pulses is produced in which the clock pulses interlaced with data pulses appear like the data pulses in one half of a data cell period, each read pulse having a controlled pulse width equal to one quarter of a data cell period. The pulses in the read pulse train produce pulses of equal pulse width at the output of the two phase detection gates when the phase of the pulses read is precisely one-eighth of a data cycle out of phase with respect to the squarewave feedback signal. Any shift of the phase relationship between the read pulse period and the feedback pulse period through ±45° (±⅛ data period) will increase the width of the output pulse from one gate while decreasing the width of the output pulse from the other gate by a corresponding amount. Consequently, upon filtering the output pulses of the gates, there will be produced two DC signals. The difference between the two DC signals is linearly proportional to the phase error, and the sign of the difference will correspond to the polarity (direction) of the phase error. The difference signal can be used to acquire and maintain synchronization between the read pulse train and the feedback pulses.

For a data period phase error in the range from +45° to −45°, the sign (polarity) of the phase error signal is set to drive the frequency of the VCO in a direction that will restore the phase relationship. In addition, the magnitude of the phase error signal increases linearly with phase error. Once the phase error exceeds ±45°, the sign (polarity) of the phase error signal remains correct. However, the magnitude of the phase error signal decreases linearly with increasing phase error from 45° to 90°, making synchronization improbable.

For double-frequency recording, a phase shift in the feedback pulses through half a data cell period is of no consequence because the feedback pulses are symmetrical. In other words, since every feedback pulse is equal to half the feedback pulse period, it matters not which pulse is synchronized with the data pulse as between two successive feedback pulses occurring during the same data bit period. However, a problem arises if the density of the data pulses is increased, such as from 2200 bits per inch to 4400 bits per inch (BPI).

If the same double-frequency recording scheme is to be employed for the higher data density (4400 BPI), the bandwidth of the PLL must be increased correspondingly. Although that could be achieved, there would still be a problem of bit density on the media, i.e., 4400 bits per inch recorded with the double-frequency technique requires 8800 pulses per inch. At such high pulse rates, the physical size of the gap in the read and write heads becomes a very significant factor.

To avoid such a high recording pulse rate in a higher bit density system, a modified frequency modulation (MFM) recording scheme may be used in which the flux state is changed a maximum of once in a data cell period. If the recording of a data cell is controlled during four evenly spaced intervals such that the state of the flux is of a given polarity an even number of intervals, namely two, a bit 1 is recorded; and if the state of the flux is of the given polarity an odd number of intervals, namely one or three, a bit 0 is recorded. This flux pattern could, of course, be reversed in so far as the bits represented are concerned, but in either case, the read pulse pattern produced will have a maximum of one pulse per data cell period, each pulse being shaped to be one half a data pulse period. If the same phase-locked loop is now employed as for the 2200 BPI double-frequency recording scheme, the dynamic range of the PLL must be increased because a phase error of ±45° in terms of a data cell period for double-frequency recording becomes a phase error of ±π° for MFM recording. The dynamic range requirements are thus increased from 90° to 180°. The problem then is to increase the dynamic range of the PLL of the double-frequency recording system from ±45° to ±90° for use in an MFM recording system of doubled bit density without increasing the band-width of the PLL.

SUMMARY OF THE INVENTION

In accordance with a preferred embodiment of the invention, a phase-locked loop is provided with bistale means and digital logic gates for phase error detection between a data pulse train and the output of a voltage controlled oscillator, where the data pulse train is comprised of pulses spaced apart in integral multiples of a fundamental period of each cycle of a stable clock source. The bistable means is placed in a first state by each cycle of a voltage controlled oscillator which is controlled in frequency by a phase error signal, and placed in a second state by incoming data pulses. The phase of the data pulses is compared with the true and complementary output of the bistable means by separate coincidence gates connected to the respective true and complementary output terminals of the bistable means. The output pulses of the gates vary in width from a nominal half data pulse width to a full data pulse width as a limit for a 90° phase error of one polarity, and from a half data pulse width to virtually zero as a limit for a 90° phase error of opposite polarity. When the respective outputs of the two gates are separately filtered in low-pass filters and differenced in a differential amplifier, a phase error signal is produced which is linear from −90° to +90° phase error for a dynamic range of 180°.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
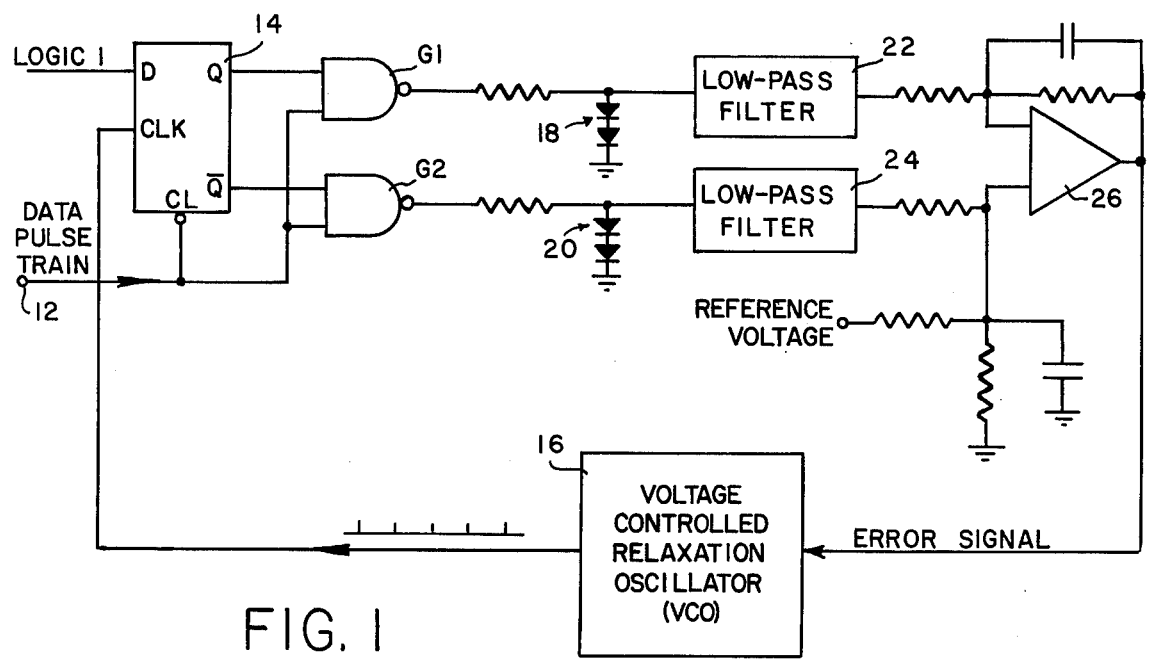
FIG. 1 is a schematic diagram of a phase-locked loop incorporating the present invention.
Figure 2:
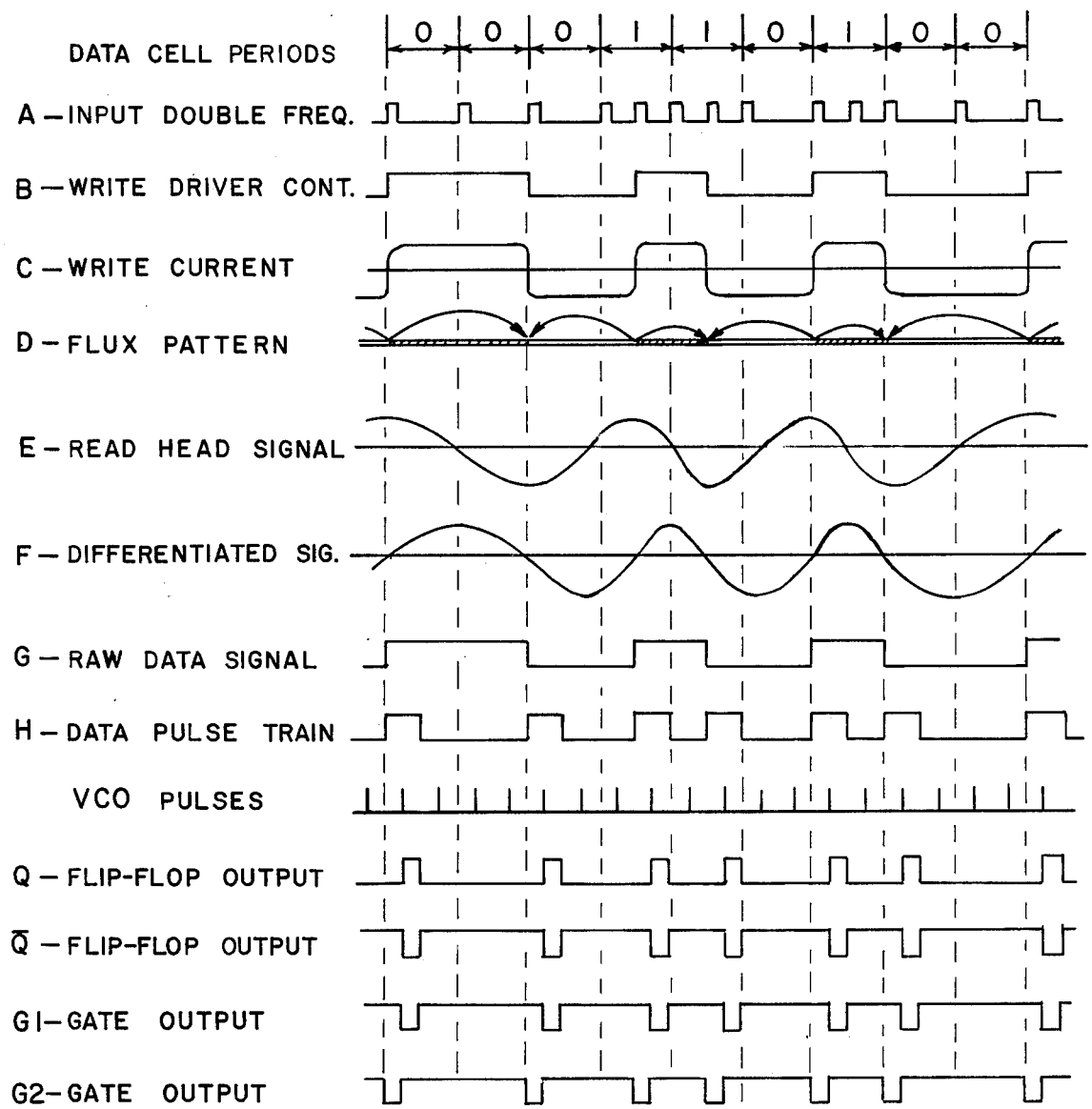
FIG. 2 is a timing diagram useful in understanding the modified frequency modulated (MFM) recording method assumed for the exemplary embodiment of the present invention.

Referring now to FIG. 1, the improved PLL is comprised of coincidence gates G1 and G2 which compare the phase of a data pulse train received at an input terminal 12 with complementary feedback signals from the true (Q) and false ($\overline{Q}$) output terminals of a D-type flip-flop 14, or a JK flip-flop operated like a D-type flip-flop, which is set by the leading edge of pulses from a voltage controlled oscillator (VCO) 16 and reset or cleared by the trailing edge of pulses in the read pulse train as will be described more fully hereinafter with reference to FIG. 2.

Figure 3:
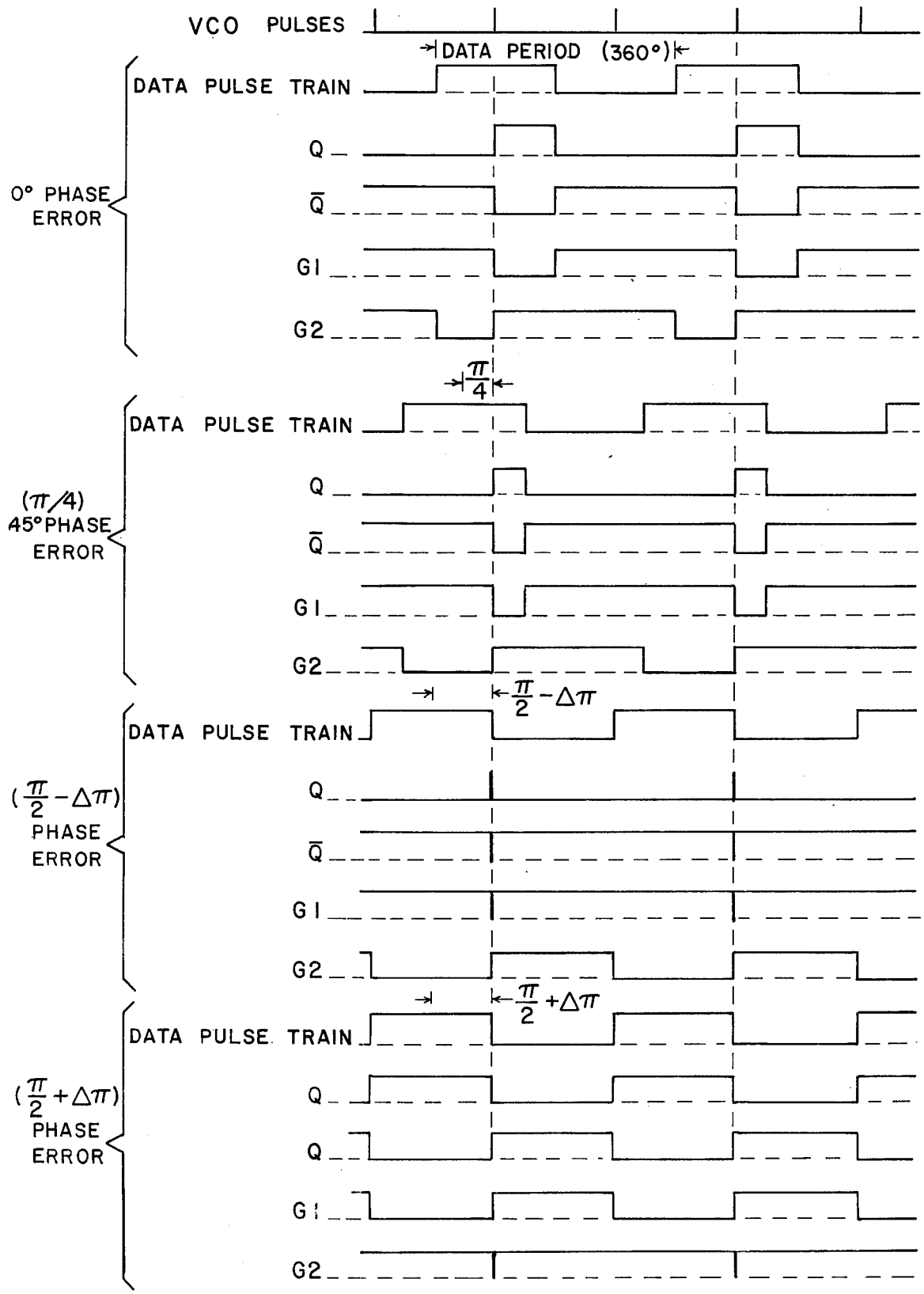
FIG. 3 is a timing diagram useful in understanding the operation of the present invention.

The complementary feedback pulses will have a pulse width equal to one-half the nominal data pulse period of a data pulse when the phase-locked loop has acquired the proper phase. Under those circumstances, both of the gates G1 and G2 will transmit pulses of equal duration. These pulses are standardized in amplitude by diode limiters 18 and 20 and fed to balanced low-pass filters (integrators) 22 and 24 to provide DC output signals proportional in amplitude to the width of pulses transmitted by the phase detection gates. These DC output signals are differenced and compared to a reference level in a differential amplifier 26 to provide a phase error signal to the VCO which is designed for linear response to a phase error signal representing a phase error in the range from −90° to +90°, as will be demonstrated with reference to FIG. 3.

The VC0 is designed to produce positive feedback pulses applied to the clock input terminal of the flip-flop 14. Flip-flop 14 and gates G1 and G2 are connected to divide each data pulse into two parts such that the difference in widths is a linear function of the error in time synchronism.

Once the phase-locked loop loop has acquired the proper phase, the leading edges of the VCO output pulses will occur at approximately the middle of a data pulse. Consequently, the complementary (Q and $\overline{Q}$) pulses from the flip-flop will be precisely half the width of a data pulse. If the phase of the date pulses should shift in a positive (leading) direction, the flip-flop 14 is cleared earlier in time, thus deceasing the width of pulses out of the Q terminal to increase the error signal applied to the VCO, thereby increasing the frequency of the VCO. That has the effect of advancing VCO pulses to the flip-flop 14 to effectively shift the VCO pulses toward the center of the date pulses. This positive phase shift correction will be linear for any phase error from zero to +90°. For a phase error of opposite polarity, the complementary (Q) feedback pulses increase in width to the cause the error signal applied to the VCO to decrease thereby decreasing the frequency of the VCO to delay in time (retard in phase) the VCO pulses applied to the flip-flop 14, thus retarding (delaying in time) the VCO output pulses such that the leading edge of the VCO pulses will again coincide with the center of the data pulses. This correction in the opposite (negative) direction is linear for a phase error from zero to −90°, thus providing a dynamic range of ±90°.

Before describing further the manner in which the phase-locked loop operates to synchronize the voltage controlled oscillator with a data pulse train over a dynamic range of 180°, the manner in which the data is recorded and read to produce the data pulse train will first be described with reference to FIG. 2. An arbitrary sequence (000110100) of nine bits is first encoded into an input double frequency signal as shown in a waveform A. That signal is divided by four to produce a signal as shown in waveform B which controls a magnetic head driver in such a manner as to change the polarity of write current at each negative going transition to produce the write current shown in waveform C. The write current controls the recorded flux pattern shown in a "waveform" D. Upon reading the flux thus recorded, a signal is generated as shown in a waveform E. That signal is differentiated as shown in waveform F to produce a raw data signal shown in waveform G. It should be noted that the waveform G is a replica of the write driver control signal in waveform B.

The data pulse train consists of a positive pulse having a pulse width equal to half a bit period, the leading edge of each pulse corresponding to each transition, positive or negative of the raw data signal as shown in waveform H. To decode the data pulse train, each bit cell is strobed a quarter of a cell period after the beginning and before the end of its period by VCO pulses generated at twice the data rate and synchronized 90° out of phase with the date pulse train. If, upon thus strobing the data pulse train, an even number of positive samples occur for a given bit cell, the bit read is interpreted as a bit 1. Otherwise the bit read is interpreted as a bit 0.

The VCO pulses shown are assumed to be precisely synchronized 90° out of phase with the date pulse train. Between data pulses, the flip-flop 14 is held cleared, and gates G1 and G2 are not enabled. When a data pulse appears, gate G2 passes the data pulse until flip-flop 14 is toggled by the edge of a coincident VCO pulse edge, which thus closes gate G2 and opens gate G1 to pass the remainder of the width of the input data pulse. Each feedback pulse is half the width of a pulse in the data pulse train when the precise 90° phase relationship is maintained between the VCO pulses and pulses of the read train. The complementary ($\overline{Q}$) output of the flip-flop 14 is the inverse of the true (Q) output, as shown in FIG. 2. Consequently, these complementary feedback pulses are separately applied to the NAND gates G1 and G2, as shown in FIG. 1.

The negative going pulses the gates G1 and G2 shown in FIG. 2 are of equal pulses width only as long as a precise 90° phase relationship is maintained between the VCO output and the data pulse train. While that relationship is present, the phase-error signal out of the differential amplifier 26 will remain at zero with respect to a reference voltage applied to the differential amplifier. That will maintain the VCO at its nominal frequency which is twice the pulse rate of the data pulse train. If the phase of the data pulse train should vary in a positive direction to lead the output pulses from the VCO, the output pulses of the gate will decrease while the output pulses of the gate G2 will increase in width, thus developing a phase-error signal out of the differential amplifier 26 to increase the frequency of the VCO, and thereby shift the phase of VCO pulses in a positive direction. Conversely, if the data pulse train should vary in the opposite (negative) direction such that it begins to lag the VCO output pulses by more than 90°, the output pulses from the gate G1 will increase while the pulses at the output of the gate G2 will decrease in width, thereby producing a phase-error signal at the output of the differential amplifier of opposite polarity to decrease the frequency of the VCO, and thus shift the phase of the VCO output pulses in the opposite direction. The manner in which the pulse widths of the outputs of the phase detecting gates G1 and G2 vary as a function of the phase relationship between the data pulse train and the VCO output pulses is demonstrated in FIG. 4 for a dynamic range of 360°, i.e., for a range from −180° to +180°.

Figure 4:
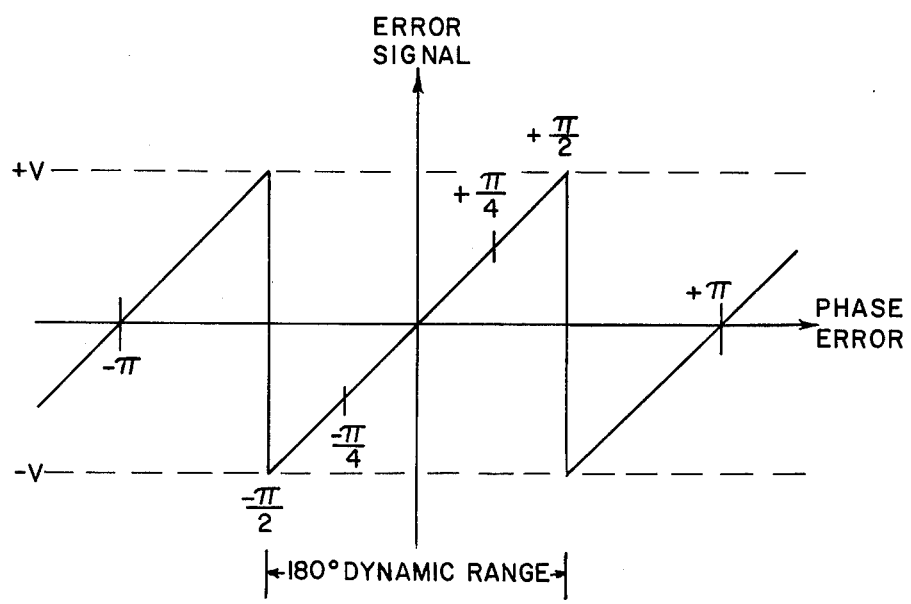
FIG. 4 is a diagram showing the linear range characteristics of the present invention.

As the phase error increases from 0° to +90°, the phase-error signal will increase linearly from zero to a maximum voltage (+V) as shown. Similarly, as the phase error increases in the opposite direction from 0° to −90°, the phase-error signal increases linearly from zero to a maximum negative voltage (−V). In that manner, linear feedback to the VCO is provided through a dynamic range of 180°, i.e., for a dynamic range from −90° to +90°. If the phase error should exceed 90° in either direction, the polarity of the error signal is inverted as shown in FIG. 4. This reversal of polarity in the phase-error signal will cause the VCO to shift in the opposite direction from that required to acquire and maintain phase. However, the wide linear range (−90° to +90°) is significantly greater than the corresponding linear range (−45° to +45°) in the phaselocked loop of the aforesaid application for a double frequency recording scheme. In that manner, the range through which phase lock is maintained by the phase locked loop of the aforesaid patent application is doubled, thus permitting the effective bit density to be doubled.

Although a particular embodiment of the invention has been described and illustrated herein, it is recognized that modifications and variations may readily occur to those skilled in the art. Some variations, such as in the implementation of the flip-flop, have already been mentioned. Other variations may occur, such as in the implementation of the VCO. For example, instead of a voltage controlled relaxation oscillator which produces a short pulse during each cycle, any other oscillator (current or voltage controlled) may be used with an appropriate signal shaping circuit, if necessary, to assure that the flip-flop is properly clocked. Another important variant is to use only one of the two gates for coincidence detector, preferably the gate G1. The low-pass filter 24 would then be omitted, and the reference voltage adjusted as necessary. However, two coincidence gates are preferred in order to obtain greater sensitivity in phase error detection, i.e., a greater error signal amplitude for a given phase error.

The embodiments of the invention in which an exclusive property or privilege is claimed are defined as follows:

1. A phase-locked-loop phase detector for synchronizing pulse outputs of a voltage controlled oscillator with a train of data pulses spaced apart in integral multiples of a fundamental clock period comprising
    bistable means for providing an output voltage signal at an output terminal and having two input terminals, a first input terminal for triggering said bistable means into one state with said output voltage signal at a first predetermined level, and a second input terminal for holding said bistable means in another state with said output voltage signal at a second predetermined voltage level in response to a signal of a predetermined one of said high and low voltage signal levels,
    means for coupling the output pulses of said voltage controlled oscillator to said first terminal of said bistable means, thereby triggering said bistable means into said one state in response to an output pulse of said voltage controlled oscillator,
    means for coupling said train of data pulses to said second input terminal of said bistable means, with a predetermined pulse polarity for holding said bistable means in said other state during intervals between data pulses,
    coincidence gating means having two input terminals and one output terminal, one input terminal connected to receive said train of data pulses with said predetermined pulse polarity and the other input terminal connected to receive said output voltage signal of said bistable means,
    a source of reference voltage, and
    error signal generating means responsive to the output terminal of said gating means and said reference voltage for producing a phase error signal proportional to the pulse width of pulses at the output terminal of said gating means for control of said voltage controlled oscillator.

2. The combination of claim 1 wherein said bistable means has a second output terminal for producing a complementary output voltage signal, said combination including a second coincidence gating means having two input terminals and one output terminal, one input terminal connected to receive said train of data pulses with said predetermined pulse polarity, and the other input terminal connected to receive said complementary output voltage signal of said bistable means, and wherein said error signal generating means is responsive to the output of both gating means and said reference voltage for producing a phase error signal proportional to the difference in pulse width of pulses at the output terminals of both gating means.

3. In a phase-locked loop, a phase comparator capable of providing phase error magnitude and direction information for synchronizing a voltage controlled oscillator with a data pulse train which consists of pulses spaced apart in integral multiples of a fundamental clock period comprising
    oscillatory means controlled in period by a phase error signal for producing output pulses of the prime period of said data pulses in the absence of any phase error, of greater period in the presence of a phase error of a given polarity, and of lesser period in the presence of a phase error of opposite polarity,
    bistable means connected to receive said output pulses and train of data pulses at separate input terminals for producing complementary pulses at Q and $\overline{Q}$ output terminals thereof in response to being set at the end of each cycle of said oscillatory means while a data pulse is present and to being held clear whenever a data pulse is not present, first coincidence gating means having two input terminals, one connected to said train of data pulses and the other to said Q output terminal of said bistable means for gating a pulse out while both input terminals thereof receive a binary signal of predetermined level, second coincidence gating means having two input terminals, one connected to said train of data pulses and the other to said $\overline{Q}$ output terminal of said bistable means for gating a pulse out while both input terminals thereof receive a binary signal of said predetermined level, and means for producing said phase error signal directly proportional to the difference in the pulse widths of pulses gated out by said first and second coincidence gating means with a given polarity when pulses from said first gating means are greater, and of opposite polarity when pulses from said second gating means are greater.

4. A phase-locked loop employed to synchronize a voltage controlled oscillator with a data pulse train, where said data pulse train is comprised of pulses spaced apart in integral multiples of a fundamental clock period comprising a flip-flop having true and complementary output terminals, and having a first input terminal adapted to place said flip-flop in a first state with said true output terminal at a predetermined high voltage level and said complementary output terminal at a predetermined low voltage level in response to the end of a cycle of said oscillator in the presence of a data pulse, and having a second input terminal adapted to place said bistable means in a second state with said true output terminal at said low voltage level and said complementary output terminal at said high voltage level in response to the absence of a data pulse, first coincidence gating means having two input terminals, one connected to said train of data pulses and the other to said true output terminal of said flip-flop for gating a pulse out while both input terminals receive a voltage signal at one of said predetermined levels, second coincidence gating means having two input terminals, one connected to said train of data pulses and the other to said complementary output terminal of said bistable means for gating a pulse out while both input terminals receive a voltage signal at said one predetermined level, means for producing said phase error signal directly proportional to the difference in the pulse widths of pulses gated out by said first and second coincidence gating means with a given polarity when pulses from said first gating means are greater in width, and of opposite polarity when pulses from said second gating means are greater in width, and means for applying said phase error signal to said voltage controlled oscillator to control the frequency thereof.

* * * * *